(12) United States Patent
Ross et al.

(10) Patent No.: US 6,738,862 B1
(45) Date of Patent: May 18, 2004

(54) BLOCK MASK TERNARY CAM

(75) Inventors: Mark A. Ross, San Carlos, CA (US); Andreas V. Bechtolsheim, Woodside, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 10/135,711

(22) Filed: Apr. 29, 2002

Related U.S. Application Data

(63) Continuation of application No. 09/130,890, filed on Aug. 7, 1998, now Pat. No. 6,389,506.

(51) Int. Cl.$^7$ .............................................. G06F 12/00
(52) U.S. Cl. ........................................ 711/108; 365/49
(58) Field of Search ............................. 711/108; 365/49

(56) References Cited

U.S. PATENT DOCUMENTS

| | | | |
|---|---|---|---|
| 3,648,254 A | 3/1972 | Beausoleil | 365/49 |
| 4,296,475 A | 10/1981 | Nederlof et al. | 711/108 |
| 4,491,945 A | 1/1985 | Turner | 370/402 |
| 4,791,606 A | 12/1988 | Threewitt et al. | 365/49 |
| 4,996,666 A | 2/1991 | Duluk, Jr. | 365/49 |
| 5,319,763 A | 6/1994 | Ho et al. | 714/34 |
| 5,383,146 A * | 1/1995 | Threewitt | 365/49 |
| 5,386,413 A * | 1/1995 | McAuley et al. | 370/392 |
| 5,440,715 A | 8/1995 | Wyland | 711/108 |
| 5,450,351 A | 9/1995 | Heddes | 365/49 |
| 5,515,370 A | 5/1996 | Rau | 370/399 |
| 5,841,874 A | 11/1998 | Kempke et al. | 713/160 |
| 5,920,886 A * | 7/1999 | Feldmeier | 711/108 |
| 5,930,359 A | 7/1999 | Kempke et al. | 713/160 |
| 5,978,885 A | 11/1999 | Clark, II | 711/108 |
| 6,000,008 A | 12/1999 | Simcoe | 711/108 |
| 6,041,389 A | 3/2000 | Rao | 711/108 |
| 6,047,369 A | 4/2000 | Colwell et al. | 712/217 |
| 6,069,573 A | 5/2000 | Clark, II et al. | 341/50 |
| 6,097,724 A | 8/2000 | Kartalopoulos | 370/395.5 |
| 6,148,364 A | 11/2000 | Srinivasan et al. | 711/108 |
| 6,181,698 B1 | 1/2001 | Hariguchi | 370/392 |
| 6,199,140 B1 | 3/2001 | Srinivasan et al. | 711/108 |
| 6,289,414 B1 * | 9/2001 | Feldmeier et al. | 711/108 |
| 6,377,577 B1 | 4/2002 | Bechtolsheim et al. | 370/392 |
| 6,389,506 B1 | 5/2002 | Ross et al. | 711/108 |
| 6,499,081 B1 * | 12/2002 | Nataraj et al. | 711/108 |

OTHER PUBLICATIONS

Jon P. Wade and Charles G. Sodini, "A Ternary Content Addressable Search Engine," IEEE Journal of Solid–State Circuits, vol. 24, No. 4, Aug. 1989, pp. 1003–1013.

Teuvo Kohonen, Content–Addressable Memories, 1987, pp. 128–129 and 142–144, Springer–Verlag, New York.

Brian Dipert, ed., "Special–purpose SRAMs Smooth the Ride," EDN, Jun. 24, 1999, pp. 93–104.

"What is a CAM (Content–Addressable Memory)?," Application Brief AB–N6, Rev. 2a, Music Semiconductors, Milpitas, CA, Sep. 30, 1998, 4 pages.

"Reading Out the Valid LANCAM Memory Entries," Application Brief AB–N4, Rev. 1a, Music Semiconductors, Milpitas, CA, Sep. 30, 1998, 4 pages.

(List continued on next page.)

*Primary Examiner*—Mano Padmanabhan
*Assistant Examiner*—Mehdi Namazi
(74) *Attorney, Agent, or Firm*—The Law Office of Kirk D. Williams

(57) ABSTRACT

The invention provides a method and system for flexible matching of data in a CAM, that does not use the overhead of one mask bit for each matched value bit. The entries of the CAM are logically grouped in a set of blocks, each block having a single mask that applies to all entries in the block. Each block includes a predetermined number of CAM entries, such as a block of 16 entries. However, in alternative embodiments, the number of CAM entries for each block could be predetermined to be a different number, or could be dynamically selected with the values that are entered into the CAM.

5 Claims, 3 Drawing Sheets

OTHER PUBLICATIONS

"Extending the LANCAM Comparand," Application Brief AB–N3, Rev. 1.0a Draft, Music Semiconductors, Milpitas, CA, Sep. 30, 1998, 4 pages.

"Advantages of CAM in ASIC–Based Network Address Processing," Application Brief AB–N11, Rev. 1.2a Draft, Music Semiconductors, Milpitas, CA, Sep. 30, 1998, 4 pages.

"Virtual Memory Applications of the MU9C1480A LAN-CAM," Application Note AN–N3, Rev. 1a, Music Semiconductors, Milpitas, CA, Sep. 30, 1998, 12 pages.

"Using the MU9C1965A LANCAM MP for Data Wider than 128 Bits," Application Note AN–N19, Rev. 1a, Music Semiconductors, Milpitas, CA, Sep. 30, 1998, 16 pages.

"Fast IPv4 and IPv4 CIDR Address Translation and Filtering Using the MUAC Routing CoProcessor (RCP)," Application Note AN–N25, Rev. 0a, Music Semiconductors, Milpitas, CA, Oct. 1, 1998, 16 pages.

"Using MUSIC Devices and RCPs and IP Flow Recognition," Application Note AN–N27, Rev. 0, Music Semiconductors, Milpitas, CA, Oct. 21, 1998, 20 pages.

"Wide Ternary Searches Using Music CAMs and RCPs," Application Note AN–N31, Rev. 0, Music Semiconductors, Milpitas, CA, Apr. 13, 1999, 8 pages.

* cited by examiner

BLOCK MASK TERNARY CAM

This is a continuation of application Ser. No. 09/130,890, filed Aug. 7, 1998, now U.S. Pat. No. 6,389,506, issued May 14, 2002.

BACKGROUND OF THE INVENTION

1. Field of the Invention

This invention relates to a ternary CAM.

2. Related Art

In computer networks for transmitting information, routing devices are used to process incoming messages and to determine the disposition for those messages. Most messages are ultimately forwarded to their destination, using routing information maintained at the router and used in response to routing information contained in a header for the message.

One problem in the known art is that the task of processing incoming messages by the router can take substantial time. Performing additional functions besides forwarding could also increase the amount of processing time. These additional functions can include access control, quality of service features, and implementing other administrative policies. Accordingly, it would be advantageous to reduce the amount of processing time used by the router, so as to be able to route more messages in each unit time.

One known solution is to organize routing information in the router so it can be readily accessed, such as using a tree structure, a trie structure, or a hash table. While these methods of data access are relatively quick, they still take an amount of time that grows with the number of possible different selections. For example, some of these methods take about O(log N) time to perform, where N is the number of possible different selections. When the number of possible different selections is large, this can represent a substantial amount of processing time for each message. These methods of data access also have the drawback that they take variable amounts of time. This makes allocating processing time, queueing space, and other router (or switch) resources more difficult. Accordingly, it would be advantageous to be able to process each message in a known bounded time, such as O(constant) time.

One idea with promise is to use a CAM (content addressable memory) to match key information from each incoming message with a disposition for that message. However, the information used for routing has a great deal of redundancy. Having one entry in the CAM for each possible set of routing information (or even for each set of routing information known to the router), the CAM would need to be unduly large and unwieldy. Accordingly, it would be desirable to have one entry in the CAM stand for multiple sets of routing information.

One known method by which each CAM entry can stand for multiple sets of information is to provide a ternary CAM, that is, one in which each bit entry for matching is either a logical "0," a logical "1," or a logical "don't care." In known ternary CAMs, each entry for matching comprises two bits for each value bit, a first bit to indicate whether the bit need be matched at all, and a second bit to indicate (if matched) to what value the bit must match. However, by providing a mask bit for each value bit (thus, two bits total for each value bit) these known ternary CAMs have a relatively large amount of overhead. This limits the maximum size of the CAM that can be implemented in a selected chip area with a selected manufacturing technology.

Accordingly, it would be desirable to provide a method and system for flexible matching of data in a CAM that does not use the overhead of one mask bit for each matched value bit. This advantage is achieved in an embodiment of the invention in which the entries of the CAM are logically grouped in a set of blocks, each block having a single mask that applies to all entries in the block.

SUMMARY OF THE INVENTION

The invention provides a method and system for flexible matching of data in a CAM that does not use the overhead of one mask bit for each matched value bit. The entries of the CAM are logically grouped in a set of blocks, each block having a single mask that applies to all entries in the block. In a preferred embodiment, each block includes a predetermined number of CAM entries, such as a block of sixteen entries. However, in alternative embodiments, the number of CAM entries for each block could be predetermined to be a different number, or could be dynamically selected with the values that are entered into the CAM.

DESCRIPTION OF THE PREFERRED EMBODIMENT

In the following description, a preferred embodiment of the invention is described with regard to preferred process steps and data structures. Those skilled in the art would recognize after perusal of this application that embodiments of the invention can be implemented using circuits adapted to particular process steps and data structures described herein, and that implementation of the process steps and data structures described herein would not require undue experimentation or further invention.

System Elements

Figure 1:
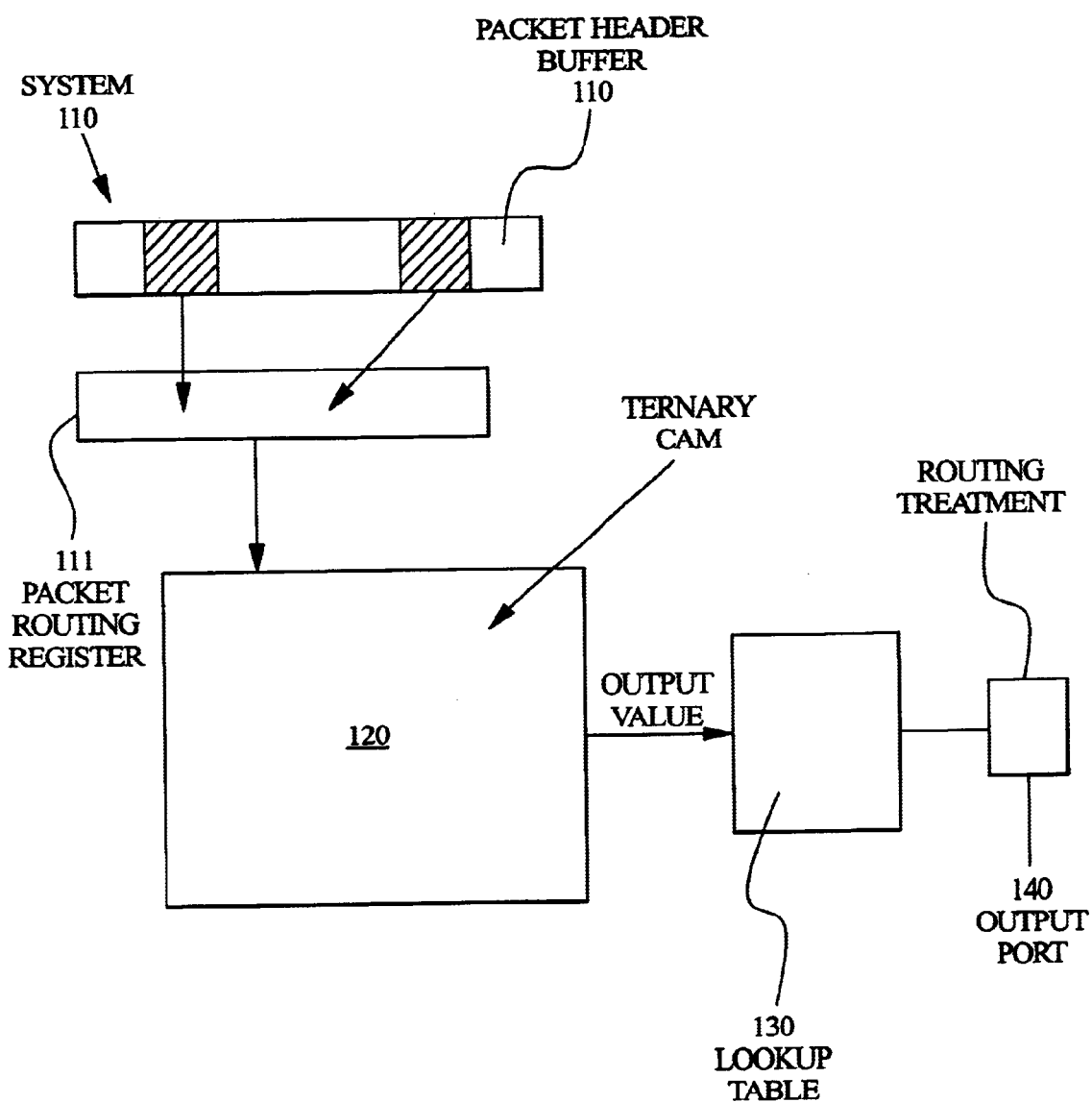
FIG. 1 shows a block diagram of a system for routing lookup using a ternary CAM.

FIG. 1 shows a block diagram of a system for routing lookup using a ternary CAM.

A system 100 for routing lookup includes a packet header buffer 110, a ternary CAM 120, a lookup table 130, and an output port 140.

The packet header buffer 110 includes selected information from a header for a packet to be routed. The selected information includes a destination address from the packet header, and can also include a source address from the packet header.

Although a preferred embodiment is described with regard to certain routing and transmission protocols, such as IP (internet protocol) or variants thereof, the invention is also applicable to a wide variety of routing and transmission protocols, such as IPX, variants thereof, or other known routing or transmission protocols.

In a preferred embodiment, the selected information from the packet header can include information such as described in the following patent applications:

U.S. application Ser. No. 08/581,134, titled "Method For Traffic Management, Traffic Prioritization, Access Control, and Packet Forwarding in a Datagram Computer Network", filed Dec. 29, 1995, in the name of inventors David R. Cheriton and Andreas V. Bechtolsheim, assigned to Cisco Technology, U.S. application Ser. No. 08/655,429, titled "Network Flow Switching and Flow Data Export", filed May 28, 1996, in the name of inventors Darren Kerr and Barry Bruins, and assigned to Cisco Technology, Inc.; and U.S. application Ser. No. 08/771,438, titled "Network Flow Switching and Flow Data Export", filed Dec. 20, 1996, in the name of inventors Darren Kerr and Barry Bruins, assigned to Cisco Technology, Inc.

These applications are collectively referred to herein as the "Netflow Switching Disclosures". Each of these applications is hereby incorporated by reference as if fully set forth herein.

The system 100 couples the selected information from the packet header buffer 110 to a packet routing register 111. The packet routing register 111 includes the selected information, plus an identifier for its associated packet, so that the associated packet can be reunited with the selected information after a routing treatment is selected for the packet.

The selected information from the packet header buffer 110 is coupled to the ternary CAM 120.

The ternary CAM 120 is disposed for receiving the selected information from the packet header buffer 110 as an input value. The CAM 120 includes a plurality of content addressable entries, each of which is responsive to the input value. If one or more of the entries matches the input value, it provides an output pointer responsive thereto. The CAM 120 selects one of those output pointers as its output value.

The output value from the CAM 120 is coupled to the lookup table 130. The lookup table 130 is responsive to the output value from the CAM 120, and is disposed for providing a routing treatment for the packet. The routing treatment for the packet is coupled to the output port 140.

The system 100 includes a set of elements (not shown) for performing bookkeeping processing for packets, including (a) identifying packet headers, (b) buffering packet data, and (c) reuniting packet headers with corresponding packets. The system 100 also includes a processor (not shown) for performing more complex tasks with regard to packets, such as can be indicted by the routing treatment at the output port 140.

The routing treatment at the output port 140 can include a variety of types of information about how to treat the packet, including one or more of the following:

A routing decision for the packet. This can include an output interface on which to forward the packet, an indicator to drop the packet, or an indicator that the packet should be forwarded to the processor for further routing decision treatment.

An access control decision for the packet. This can include an instruction to allow forwarding for the packet, an instruction to deny forwarding for the packet, or an indicator that the packet should be forwarded to the processor for further access control treatment.

A quality of service decision for the packet.

An accounting decision for the packet. This can include an account to be charged for the packet, a type of packet to be counted for data collection, or a decision for the packet that implements one or more other accounting purposes.

A decision for the packet that implements one or more other administrative policies.

These types of information can be recorded in a single region of the lookup table 130, or in a plurality of regions of the lookup table 130 (such as one region for each type of information).

Ternary CAM Block Masking

Figure 2:
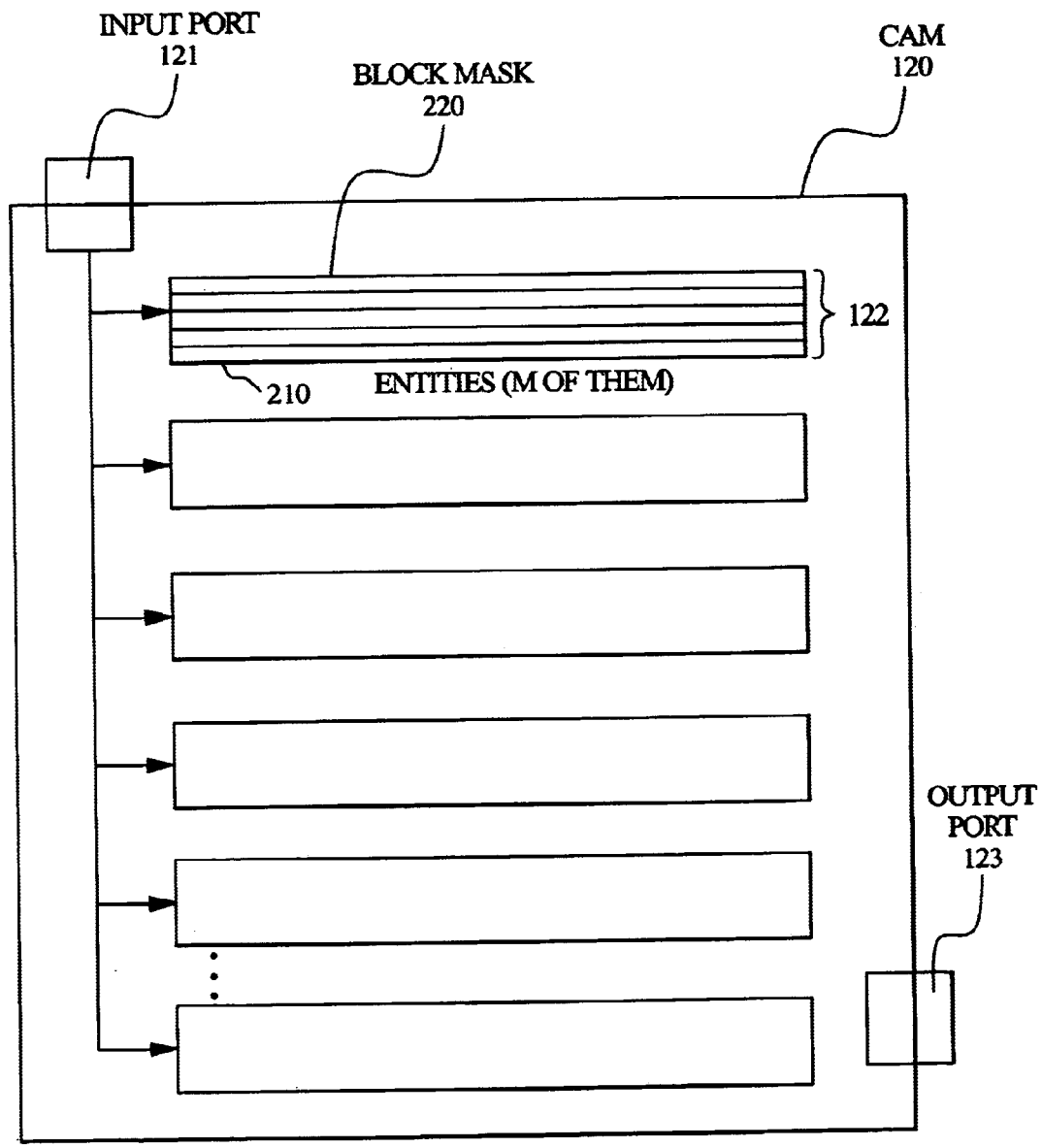
FIG. 2 shows a block diagram of a ternary CAM with a set of block masks.

FIG. 2 shows a block diagram of a ternary CAM 120 with a set of block masks.

The CAM 120 includes an input port 121, a plurality of entry blocks 122, and an output port 123.

The input port 121 is coupled to the selected information from the packet header buffer 110 and is disposed for receiving the input value for the CAM 120 therefrom. The input port 121 is coupled to each of the entry blocks 122 and is disposed for transmitting the input value to each one.

Each entry block 122 includes a plurality M of content addressable entries 210, each having a separate entry matching value, and a single block mask entry 220, having a single entry matching mask. Thus, the number of entry matching values exceeds the number of entry matching masks by a factor of M.

In a preferred embodiment, the value of M is about 16, although values of 8 or 32 would also be workable. There is no particular requirement that the value of M need be a power of two.

There is also no particular requirement that the value of M need be the same for each entry block 122. Thus for example, the CAM 120 can include a first set of entry blocks 122 each having a value of M equal to 16, and a second set of entry blocks 122 each having a value of M equal to 32.

There is also no particular requirement that the value of M need be static for each entry block 122. Thus, the CAM 120 can include at least one entry block 122 having a plurality N of block masks, and include the capability for dividing that entry block 122 into separate functional entry blocks 122 each responsive to a different one of the plurality of block masks.

For example, the CAM 120 can include one particular entry block 122 with a value of M equal to thirty-two, and having a value of N equal to two (that is, two independent block masks 220). The CAM 120 can have the capability of splitting that entry block 122 into first and second functional entry blocks 122. Each of the first and second functional entry blocks 122 could have a value of M equal to sixteen, and a value of N equal to one (that is, a single independent block mask 220 for each of the function entry blocks 122).

Each one of the M content addressable entries 210 is responsive to the input value coupled from the input port 121, to its entry matching value, and to its associated entry matching mask. For each entry 210, the input value is compared against both its entry matching value and its associated entry matching mask. The input value is considered to match the entry if each bit of the input value either (a) matches a corresponding bit of the entry matching value, or (b) is masked by a corresponding bit of the entry matching mask.

Method of Operation

Figure 3:
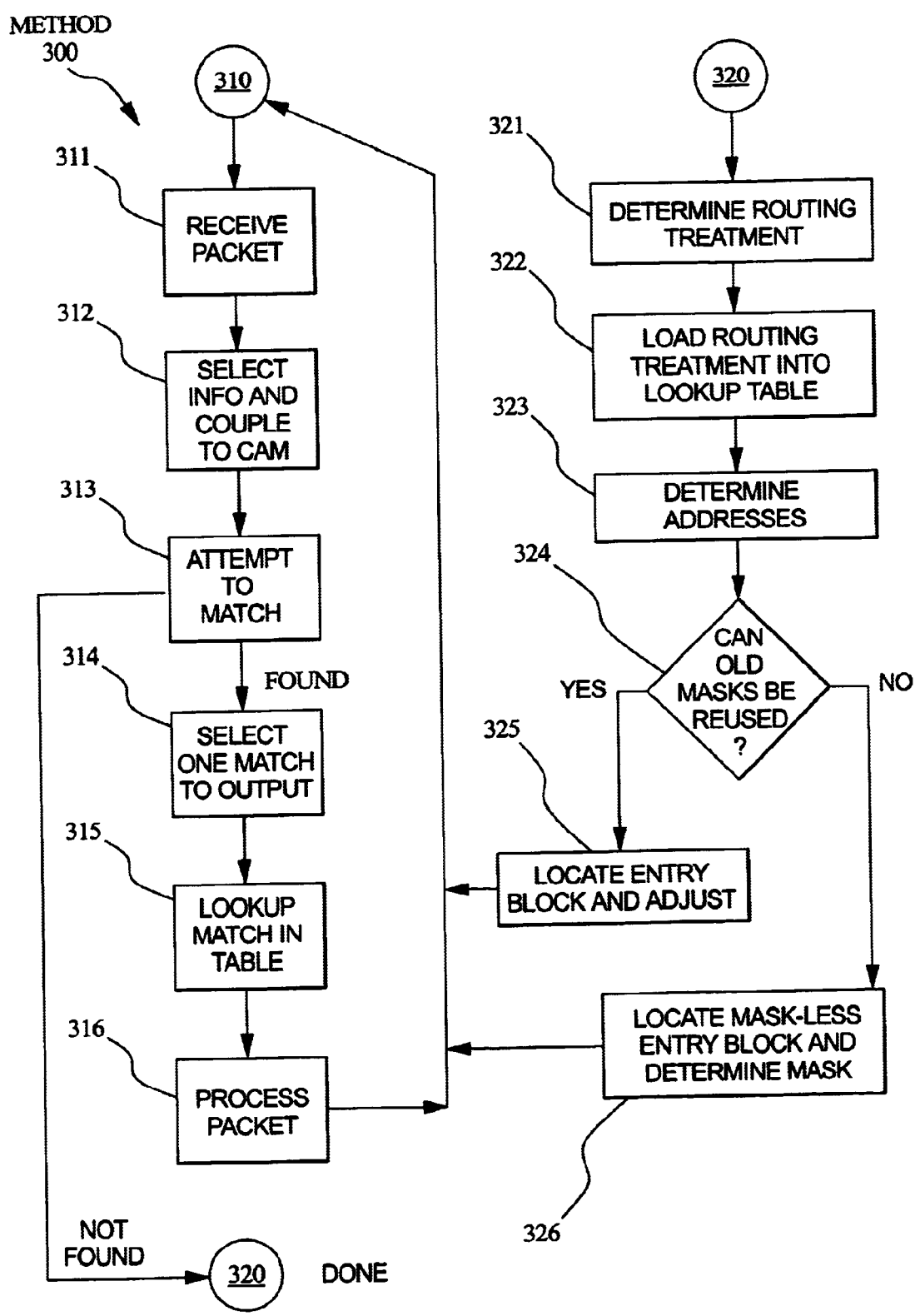
FIG. 3 shows a flow diagram of a method for loading and using the ternary CAM with block masks.

FIG. 3 shows a flow diagram of a method for loading and using the ternary CAM with block masks.

A method 300 is performed collectively by the system 100, including the packet header buffer 110, the ternary CAM 120, the lookup table 130, the output port 140, and the processor (not shown).

At a flow point 310, the system 100 is ready to receive a packet.

At a step 311, the system 100 receives a packet. The system 100 records a packet header for the packet in the packet header buffer 110.

As noted above, the packet header includes information about routing treatment for the packet, which can include one or more of: a routing decision, an access control decision, a quality of service decision, an accounting decision, and another administrative decision.

At a step 312, the system 100 selects information from the packet header and couples that information to the CAM 120. That information can include a destination address for the packet and possibly a source address for the packet.

At a step 313, the CAM 120 attempts to match the input value at its input port 121, in response to matching values and mask values for each of its entry blocks 122. If the CAM 120 finds at least one match, the method proceeds with the next step. If the CAM 120 does not find any match, the method proceeds with the flow point 320.

At a step 314, the CAM 120 selects one of the (one or more) matches as an output value, and couples that output value to the lookup table 130.

At a step 315, the lookup table 130, responsive to the output value from the CAM 120, provides a selected routing treatment for the packet.

At a step 316, the system 100 processes the packet according to the selected routing treatment. The method 300 is ready for another packet and returns to the flow point 310.

At a flow point 320, the system 100 has received a packet for which it does not have a routing treatment.

At a step 321, the processor determines a routing treatment for the packet.

At a step 322, the system 100 loads the routing treatment into the lookup table 130.

At a step 323, the system 100 determines the addresses for referencing the packet in the CAM 120.

At a step 324, the system 100 determines if the masks associated with other entries in the CAM 120 can be used for referencing the new routing treatment, so that the addresses for referencing the packet can be treated together with other addresses already recorded in the CAM 120. If so, the method proceeds with the step 325. If not, the method proceeds with the step 326.

The nature of processing in the step 324 is further illuminated by information available in a published RFC relating to CIDR (classless inter-domain routing).

At a step 325, the system 100 locates an entry block 122 already having a correct mask for the new address. The system 100 adjusts the entry mask value for that entry block 122 so that entry block 122 matches the new address and the new routing treatment as well.

In a preferred embodiment, the system 100 can select an entry block 122 with additional space, or select a new entry block 122, responsive to the new address, so as to reserve such additional space in one or more entry blocks 122.

The system 100 is then ready to receive a new packet, and the method 300 proceeds with the flow point 310.

At a step 326, the system 100 locates an entry block 122 not already having an assigned mask and routing treatment. The system 100 determines a mask for the new address, and adjusts the entry mask value for that entry block 122 so that entry block 122 matches the new address. The system 100 adjusts the output value for that entry block 122 to indicate the correct routing treatment for the new address.

The system 100 is then ready to receive a new packet, and the method 300 proceeds with the flow point 310.

ALTERNATIVE EMBODIMENTS

Although preferred embodiments are disclosed herein, many variations are possible which remain within the concept, scope, and spirit of the invention, and these variations would become clear to those skilled in the art after perusal of this application.

What is claimed is:

1. A ternary content-addressable memory (TCAM) comprising:

a first TCAM block including: a plurality of first TCAM block entries, each of the plurality of first TCAM block entries includes a plurality of value bits; and a first block mask entry including a plurality of mask bits; wherein each mask bit of the first block mask entry identifies for each of the plurality of first TCAM block entries whether a corresponding value bit is masked during a lookup operation on the first TCAM block for a particular lookup value; and a second TCAM block including: a plurality of second TCAM block entries, each of the plurality of second TCAM block entries includes a plurality of value bits; and a second block mask entry including a plurality of mask bits; wherein each mask bit of the second block mask entry identifies for each of the plurality of second TCAM block entries whether a corresponding value bit is masked during a lookup operation on the second TCAM block for the particular lookup value.

2. The ternary content-addressable memory of claim 1, wherein the plurality of first TCAM block entries includes a quantity J of entries, the plurality of second TCAM block entries includes a quantity K of entries, and the values of J and K are equal.

3. The ternary content-addressable memory of claim 1, wherein the plurality of first TCAM block entries includes a quantity J of entries, the plurality of second TCAM block entries includes a quantity K of entries, and the values of J and K are not equal.

4. A ternary content-addressable memory (TCAM) comprising a first TCAM block, the first TCAM block including: a plurality of TCAM entries, each of the plurality of TCAM entries includes a plurality of value bits, the plurality of TCAM entries includes a first subset of TCAM entries and a second subset of TCAM entries, the first and second subsets being non-overlapping subsets of the plurality of TCAM entries, with each of the first and second subsets including at least two TCAM entries; a first block mask entry including a plurality of mask bits, wherein each mask bit of the first block mask entry identifies whether a corresponding value bit is masked during a lookup operation on the first subset of value entries based on a lookup value; and a second block mask entry including a plurality of mask bits, wherein each mask bit of the second block mask entry identifies whether a corresponding value bit is masked during a lookup operation on the second subset of value entries based on the lookup value.

5. The ternary content-addressable memory of claim 4, further comprising: a second TCAM block, the second TCAM block including: a plurality of second TCAM entries, each of the plurality of second TCAM entries includes a plurality of value bits; and a third block mask entry including a plurality of mask bits; wherein each mask bit of the third block mask entry identifies whether a corresponding value bit is masked during a lookup operation on the plurality of second TCAM entries based on the lookup value.

* * * * *

UNITED STATES PATENT AND TRADEMARK OFFICE
CERTIFICATE OF CORRECTION

PATENT NO. : 6,738,862 B1
DATED : May 18, 2004
INVENTOR(S) : Ross et al.

Page 1 of 1

It is certified that error appears in the above-identified patent and that said Letters Patent is hereby corrected as shown below:

Column 2,
Line 30, replace "DESCRIPTION" with -- DETAILED DESCRIPTION --
Line 67, replace "Cisco Technology," with -- Cisco Technology, Inc; --

Signed and Sealed this

Fourth Day of January, 2005

JON W. DUDAS
*Director of the United States Patent and Trademark Office*